United States Patent
Gao et al.

(10) Patent No.: US 11,059,277 B2
(45) Date of Patent: Jul. 13, 2021

(54) CURVED SCREEN LAMINATING APPARATUS AND LAMINATING METHOD

(71) Applicant: WUHAN CHINA STAR OPTOELECTRONICS SEMICONDUCTOR DISPLAY TECHNOLOGY CO., LTD., Hubei (CN)

(72) Inventors: Siheng Gao, Hubei (CN); Jinlong Tan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 153 days.

(21) Appl. No.: 16/091,111

(22) PCT Filed: Aug. 8, 2018

(86) PCT No.: PCT/CN2018/099400
§ 371 (c)(1),
(2) Date: Oct. 4, 2018

(87) PCT Pub. No.: WO2019/227670
PCT Pub. Date: Dec. 5, 2019

(65) Prior Publication Data
US 2020/0047475 A1 Feb. 13, 2020

(30) Foreign Application Priority Data
May 31, 2018 (CN) .......................... 201810543843.4

(51) Int. Cl.
*B32B 37/06* (2006.01)
*B32B 17/06* (2006.01)
(Continued)

(52) U.S. Cl.
CPC ............ *B32B 37/06* (2013.01); *B32B 17/064* (2013.01); *H01L 51/5246* (2013.01);
(Continued)

(58) Field of Classification Search
CPC ........ B32B 37/06; B32B 17/064; H01L 51/56
See application file for complete search history.

(56) References Cited

U.S. PATENT DOCUMENTS

| 2011/0039967 A1* | 2/2011 | Wilson | B82Y 30/00 521/164 |
| 2011/0300358 A1* | 12/2011 | Blohowiak | B32B 15/14 428/215 |

(Continued)

FOREIGN PATENT DOCUMENTS

| CN | 107978623 A | * | 5/2018 | |
| CN | 107039604 B | * | 9/2018 | H01L 51/56 |

(Continued)

OTHER PUBLICATIONS

Translation of KR-20140052714-A (Year: 2014).*
Translation of KR-20180013370-A (Year: 2018).*
Machine Translation of CN-107978623-A (Year: 2018).*

*Primary Examiner* — Daniel McNally
(74) *Attorney, Agent, or Firm* — Mark M. Friedman (57) ABSTRACT

A curved screen laminating apparatus and a laminating method is provided. The flexible display panel is driven to bend via a photoactive polymer layer which is controlled by a light source; next, the bent flexible display panel and the curved glass are laminated; last, the flexible display panel and the curved glass are laminated. Compared with the prior art, air bubbles are effectively discharged from edges by employing a segmented lamination which ensures product yields.

20 Claims, 4 Drawing Sheets

(51) Int. Cl.
    *H01L 51/52*     (2006.01)
    *H01L 51/56*     (2006.01)

(52) U.S. Cl.
    CPC ........ *H01L 51/56* (2013.01); *B32B 2457/206* (2013.01); *H01L 2251/5338* (2013.01)

(56) References Cited

U.S. PATENT DOCUMENTS

| | | | |
|---|---|---|---|
| 2014/0096892 A1* | 4/2014 | Cho | B32B 37/14 156/99 |
| 2015/0041766 A1* | 2/2015 | Naijo | H01L 27/3244 257/40 |
| 2018/0301643 A1* | 10/2018 | Xu | H01L 51/524 |

FOREIGN PATENT DOCUMENTS

| | | | |
|---|---|---|---|
| KR | 20140052714 A | * | 5/2014 |
| KR | 20180013370 A | * | 2/2018 |

\* cited by examiner

CURVED SCREEN LAMINATING APPARATUS AND LAMINATING METHOD

FIELD OF INVENTION

The present disclosure relates to the field of liquid crystal display technology, and more particular to a curved screen laminating apparatus and a laminating method.

BACKGROUND OF INVENTION

Active matrix/organic light emitting diodes (AMOLEDs) are a new growth point for the future display industry in which flexible AMOLEDs can meet high requirements for mobile and portable products in the market.

Flexible AMOLED processes are complicated where three-dimensional (3D) laminating is one of the key technologies for manufacturing curved screens. One existing 3D laminating mainstream technology uses guide film technology, which employs a guide film to direct the bending of a panel (a display panel, e.g. flexible display panel). On one hand, guide films can be applied to a curved glass (i.e. glass with curved surface, CG) with a large curvature. On the other hand, guide films can reduce damage to the panel. However, during the laminating process, the contact of a curved glass and a panel is by contacting a central flat surface portion and edged curved surfaces portions at the same time. Therefore, it is difficult for the air bubbles to be efficiently discharged to the edges during the laminating process.

In summary, the existing technology of 3D laminating is prone to air bubble formation, and thus results in low product yield.

SUMMARY OF INVENTION

The present disclosure provides a curved screen laminating apparatus and a laminating method to solve the technical problems of the existing technology of 3D laminating that air bubbles are difficult to be discharged to the edge because of the simultaneously contacting and laminating both the central flat surface portions and the edge curved surface portions of both the curved glass and the panel.

In order to solve the above-mentioned problems, the technical schemes provided by the present disclosure are as follows:

The disclosure provides a curved screen laminating apparatus for a flexible display panel to a curved glass to form a curved screen, comprising a holding platform, a suction platform, a deformation member, and a smoothing member, wherein the holding platform is configured to hold the flexible display panel; wherein a non-luminous side surface of the flexible display panel comprises a photoactive polymer layer, and the holding platform comprises a holding surface with a protuberant form;

wherein the suction platform and the holding platform are movably disposed relative to each other for suction of the curved glass;

wherein the deformation member comprises a light source, the light source is configured to irradiate the photoactive polymer layer such that the photoactive polymer layer is deformed, thereby bending the flexible display panel; and wherein the smoothing member is configured to attach the flexible display panel to a surface of the curved glass.

According to a preferred embodiment of the present disclosure, wherein the holding platform further comprises a suction hole and the suction hole is disposed on the holding surface.

According to a preferred embodiment of the present disclosure, wherein a top section of the holding surface is a flat surface and other portions of the holding surface are curved surfaces.

According to a preferred embodiment of the present disclosure, wherein a top section of the holding surface possesses viscosity.

According to a preferred embodiment of the present disclosure, wherein the smoothing member comprises a roller.

According to a preferred embodiment of the present disclosure, wherein a radius of the roller is less than a minimum radius of curvature of a curved surface to an edge of the curved glass.

According to a preferred embodiment of the present disclosure, wherein a surface portion of the roller is made of a flexible silicone material.

According to a preferred embodiment of the present disclosure, wherein the holding platform is made of a hard silicone material.

According to a preferred embodiment of the present disclosure, wherein a light emitting direction of the light source is directed toward the holding surface.

According to a preferred embodiment of the present disclosure, wherein the photoactive polymer layer comprises a carbon nanomaterial layer and a thermally responsive material layer, and the thermally responsive material layer is disposed between the flexible display panel and the carbon nanomaterial layer.

According to a preferred embodiment of the present disclosure, wherein the curved screen laminating apparatus further comprises a removal member for removing the photoactive polymer layer.

The present disclosure provides a method for laminating a curved screen using the curved screen laminating apparatus provided by the present disclosure, comprising:

suction of a curved glass by a suction platform;

holding a flexible display panel by a holding platform; wherein a non-luminous emitting side surface of the flexible display panel comprises a photoactive polymer layer and the holding platform comprises a holding surface with a protuberant form;

controlling a light source by a deformation member and irradiating the photoactive polymer layer for deforming the photoactive polymer layer, thereby bending the flexible display panel;

relatively moving the holding platform and the suction platform to each other, and laminating the curved flexible display panel and the curved glass; and attaching the flexible display panel to a surface of the curved glass by a smoothing member, wherein the step of suction of the curved glass by the suction platform comprises:

holding the curved glass to the suction platform by coupling holding.

According to a preferred embodiment of the present disclosure, wherein the step of controlling a light source by a deformation member and irradiating the photoactive polymer layer for deforming the photoactive polymer layer comprises:

activating the light source;

irradiating the holding surface from the surface of the flexible display panel where the photoactive polymer layer is not disposed.

According to a preferred embodiment of the present disclosure, wherein the suction platform and the holding platform are movably disposed relative to each other, and the step of laminating the curved flexible display panel and the curved glass comprises:

driving the holding platform to move, and laminating a protuberant portion of the flexible display panel to the curved glass; and releasing the suction of the holding platform and removing the holding platform.

According to a preferred embodiment of the present disclosure, wherein the step of attaching the flexible display panel to the surface of the curved glass by the smoothing member comprises:

starting from the protuberant portion of the flexible display panel, pressing a surface of the photoactive polymer layer to an edge of the flexible display panel using the smoothing member, thereby laminating the flexible display panel and the curved glass.

According to a preferred embodiment of the present disclosure, wherein the step of starting from the protuberant portion of the flexible display panel, pressing the surface of the photoactive polymer layer to the edge of the flexible display panel using the smoothing member, thereby laminating the flexible display panel and the curved glass comprises:

using rollers to roll towards both ends of the photoactive polymer layer, such that the flexible display panel is laminated to the curved glass from the middle to the both ends of the flexible display panel.

According to a preferred embodiment of the present disclosure, wherein the step of controlling a light source by a deformation member and irradiating the photoactive polymer layer for deforming the photoactive polymer layer comprises:

evacuating the curved screen laminating apparatus into a vacuum condition.

According to a preferred embodiment of the present disclosure, wherein the step of attaching the flexible display panel to the surface of the curved glass by the smoothing member in the method for laminating the curved screen comprises:

releasing the vacuum condition of the curved screen laminating apparatus.

According to a preferred embodiment of the present disclosure, wherein the step of attaching the flexible display panel to the surface of the curved glass by the smoothing member in the method for laminating the curved screen comprises:

removing the photoactive polymer layer.

The beneficial effects of the disclosure are that the flexible display panel is driven to bend via a photoactive polymer layer which is controlled by a light source; next, the bent flexible display panel and the curved glass are laminated; last, the flexible display panel and the curved glass are laminated. Compared with the prior art, air bubbles are effectively discharged from edges by employing a segmented lamination which ensures product yields.

DESCRIPTION OF DRAWINGS

In order to illustrate a technical solution in the embodiments or in the prior art more clearly, the accompanying drawings required in the description of the embodiments or the prior art are introduced briefly hereafter. It is obvious that the accompanying drawings in the following description are merely part of the embodiments of the present invention. People with ordinary skills in the art can obtain other drawings without making inventive efforts.

DETAILED DESCRIPTION OF THE PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention. In the accompanying figures, units with similar structures are indicated by the same reference numbers.

The present disclosure directs to the technical problems that air bubbles are difficult to be discharged to the edge because of the simultaneous contacting and laminating the curved glass and the panel with the central flat surface portion and the edge curved surfaces portion during 3D laminating process of the existing technology. The present embodiment can solve these defects.

Figure 1:
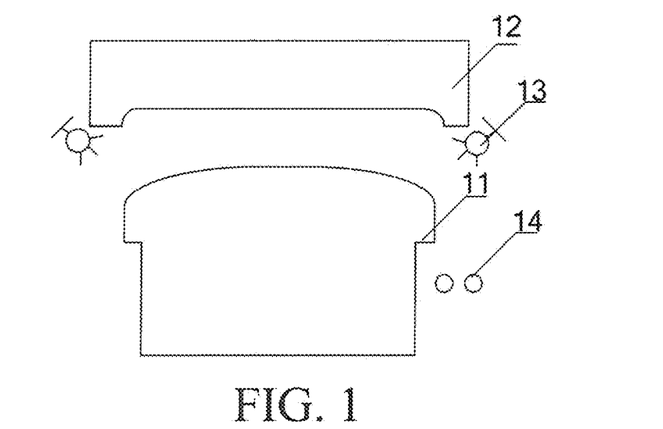
FIG. 1 is a structural schematic view of a curved screen laminating apparatus of the present disclosure.

As shown in FIG. 1, the curved screen laminating apparatus provided by the present disclosure comprises:

a holding platform 11 is configured to hold a flexible display panel, wherein a non-luminous side surface of the flexible display panel comprises a photoactive polymer layer, and the holding platform comprises a with a protuberant form;

a suction platform 12 and the holding platform 11 are movably disposed relative to each other for suction of the curved glass;

a deformation member 13 comprises a light source, the light source is configured to irradiate the photoactive polymer layer such that the photoactive polymer layer is deformed, thereby bending the flexible display panel; and a smoothing member 14 is configured to attach the flexible display panel to a surface of the curved glass.

The photoactive polymer layer, under the control of the deformation member, drives the flexible display panel to bend toward the holding surface to form a protuberant portion. The holding platform moves relative to the suction platform and laminates the protuberant portion and the curved surfaces of the flexible display panel. The smoothing member is positioned on the surface of the photoactive polymer layer. The smoothing member start from the protuberant portion of the flexible display panel and presses a surface of the photoactive polymer layer to an edge of the flexible display panel using the smoothing member, thereby laminating the flexible display panel and the curved glass.

Figure 2:
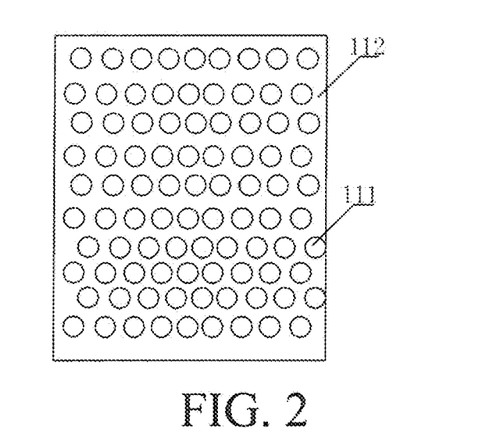
FIG. 2 is a top view of a holding surface of the present disclosure.

Optionally, the top view of the holding surface is as shown in FIG. 2. As shown in FIG. 2, the holding platform 11 further includes a suction hole 111. The suction hole 111 is defined on the holding surface 112, and is configured to use vacuum pressure for suction of a flexible display panel having a photoactive polymer layer on the holding platform.

Optionally, the holding platform is made of hard silicone material which can solve the problem of the existing holding platforms which are mostly made of flexible materials that it is difficult to ensure degree of vacuum and flatness of the contact surface during the extrusion process, and thus generating air bubbles inside the surface.

Optionally, a top section of the holding surface possesses viscosity, so that the flat surface portion of the holding surface has a certain viscosity. The flexible display panel can be better held, and possesses low viscosity and thus the flexible display panel can be peeled off with a slight peeling force.

Optionally, as shown in FIG. 1, the top section of the holding surface is a flat surface and the other portions are curved surfaces. This arrangement manner can better compatible with the deformation of the photoactive polymer layer.

Figure 3:
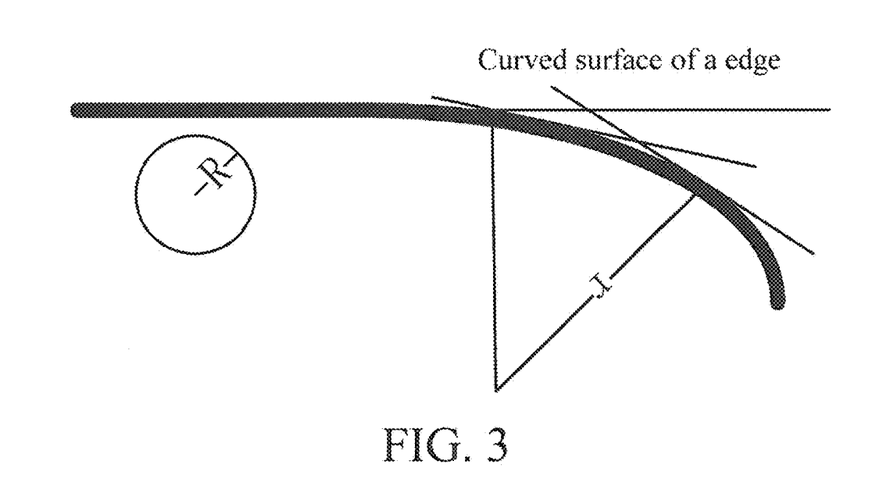
FIG. 3 is a schematic view of a roller of the present disclosure.

Optionally, as shown in FIGS. 1 and 3, the smoothing member 14 includes a roller. A radius of the roller is less than a minimum radius of curvature of a curved surface to an edge of the curved glass to ensure the laminating quality of the edge.

Optionally, the surface portion of the roller is made of a flexible silicone material so as to protect the material layer from damage, and also ensure uniform application of pressure on the material layer during the laminating process.

Optionally, the photoactive polymer layer comprises a carbon nanomaterial layer and a thermal responsive material layer. The thermal responsive material layer is disposed between the flexible display panel and the carbon nanomaterial layer.

Optionally, as shown in FIG. 1, a light emitting direction of the light source is directed toward the holding surface of the second holding member.

Photoactive polymer bending actuator is a two-layer structure composed of carbon nanomaterials, such as single-walled nanotubes (SWNTs) and graphene, and thermally responsive materials, such as polycarbonate and hydrogel.

Figure 4:
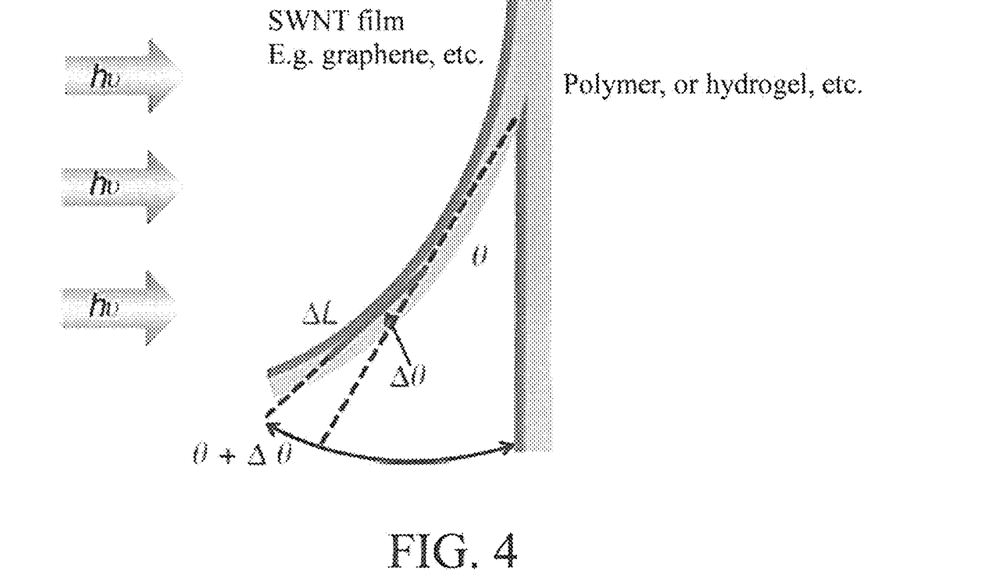
FIG. 4 is a schematic view showing a deformation of a photoactive polymer of the present disclosure.

As shown in FIG. 4, since SWNTs possesses high efficiency of converting light energy into heat energy but possesses very low coefficient of thermal expansion, a large deformation occurs when the polymer layer absorbs heat energy, and results in a bending phenomenon which is expressed by a formula:

$$\alpha_{top} - \alpha_{bottom} \neq 0$$

The light response time of this type of material is very fast. The time from non-bending to the maximum bending angle is about 0.7 s. The greater the intensity of the light, the greater the angle of bending. The intensity of the light can be controlled by controlling the bending angle.

Based on the photoactive polymer, the present embodiment will be further described with reference to FIGS. 5-10. As shown in FIG. 10, a method for laminating a curved screen provided by the present disclosure includes the following steps of:

a step S101 of suction of a curved glass by a suction platform.

Figure 5:
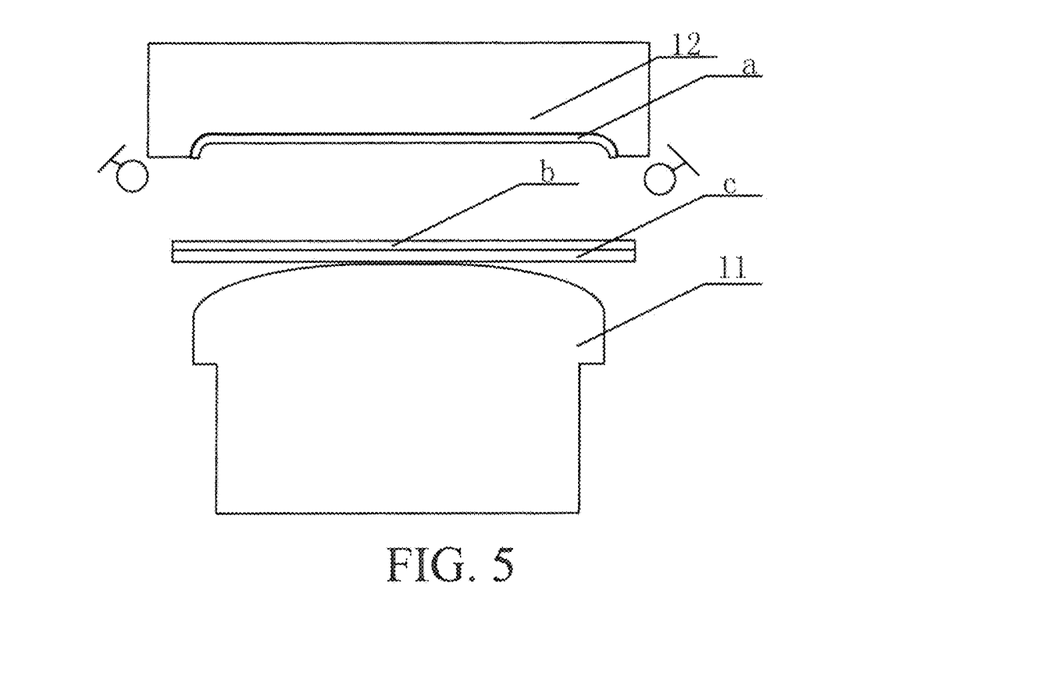
FIG. 5 is a first state diagram of a curved screen laminating process of the present disclosure.

As shown in FIG. 5, the suction platform 12 is manufactured according to curved surfaces of the curved glass a. The suction platform 12 is configured to hold the curved glass a. The edge of the curved glass a is curved, and the curved glass a is held on the suction platform by coupling holding.

A step S102 of holding a flexible display panel by a holding platform.

A non-luminous emitting side surface of the flexible display panel b comprises a photoactive polymer layer and the holding platform 11 comprises a holding surface having at least one top section. As shown in FIG. 5, the holding platform 11 holds a flexible display panel b.

A step S103 of controlling a light source by a deformation member and irradiating the photoactive polymer layer for deforming the photoactive polymer layer, thereby bending the flexible display panel.

This step is achieved by activating the light source and the light source irradiates the holding surface from the surface of the flexible display panel b where the photoactive polymer layer is not disposed.

Figure 6:
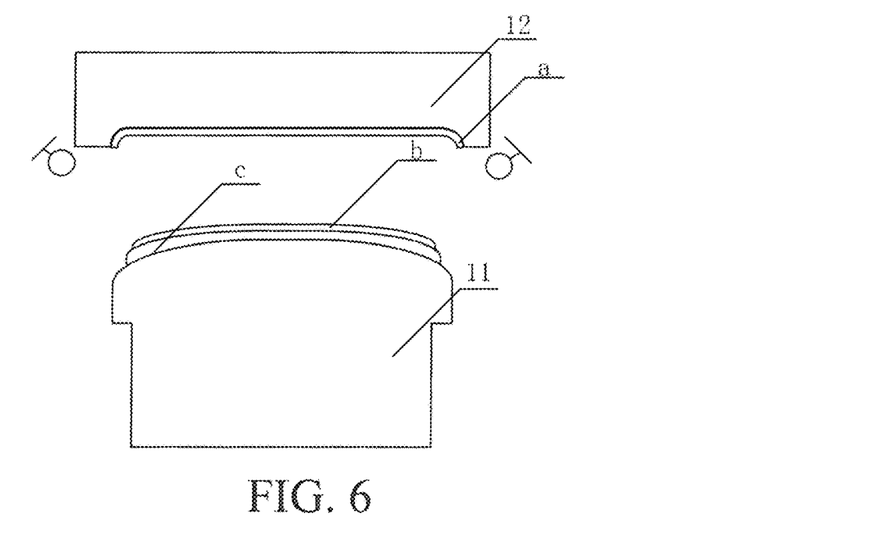
FIG. 6 is a second state diagram of the curved screen laminating process of the present disclosure.

As shown in FIG. 6, the photoactive polymer layer c drives the flexible display panel b and the photoactive polymer layer c to be in full contact with the holding surface.

After this step, in order to avoid air bubbles, the inside of the laminating apparatus can be evacuated into a vacuum condition.

A step S104 of moving the holding platform and the suction platform relative to each other, and laminating the curved flexible display panel and the curved glass.

Figure 7:
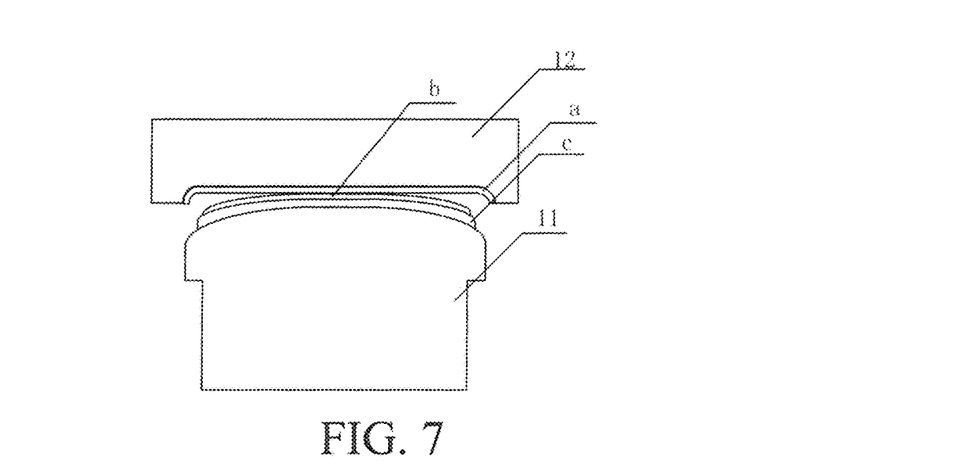
FIG. 7 is a third state diagram of the curved screen laminating process of the present disclosure.

As shown in FIG. 7, by mechanically moving the holding platform 11, the protuberant portion of the flexible display panel b is laminated to the curved glass a. At this time, the suction of the holding platform 11 is released, but the flexible display panel b is still bent under the traction of the photoactive polymer layer c and then the flexible display panel b is removed from the holding platform 1.

A step S105 of attaching the flexible display panel to a surface of the curved glass by a smoothing member.

Optionally, the smoothing member is positioned on the surface of the photoactive polymer layer. The smoothing member start from the protuberant portion of the flexible display panel and presses a surface of the photoactive polymer layer to an edge of the flexible display panel using the smoothing member, thereby laminating the flexible display panel and the curved glass.

Figure 8:
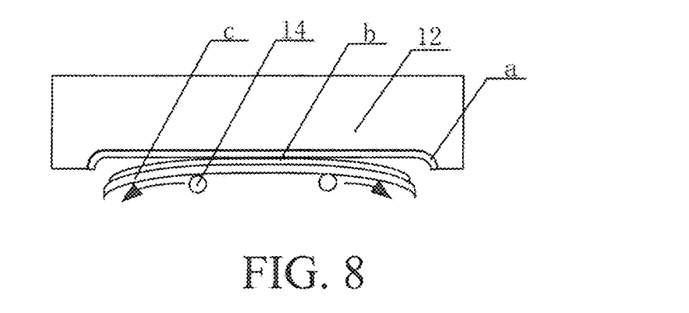
FIG. 8 is a fourth state diagram of the curved screen laminating process of the present disclosure.

As shown in FIG. 8, rollers are employed to roll on the photoactive polymer layer c towards both ends of the photoactive polymer layer c, so that the flexible display panel b is aligned to the curved glass a from a center of the flexible display panel b to both ends of the flexible display panel b. The vacuum is removed after the laminating process is completed.

A step S106 of removing the photoactive polymer layer.

Figure 9:
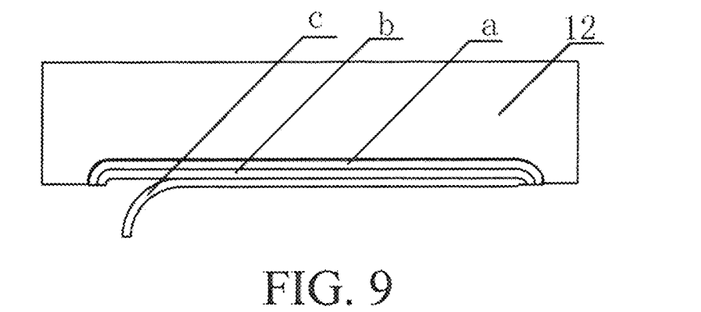
FIG. 9 is a fifth state diagram of the curved screen laminating process of the present disclosure.
Figure 10:
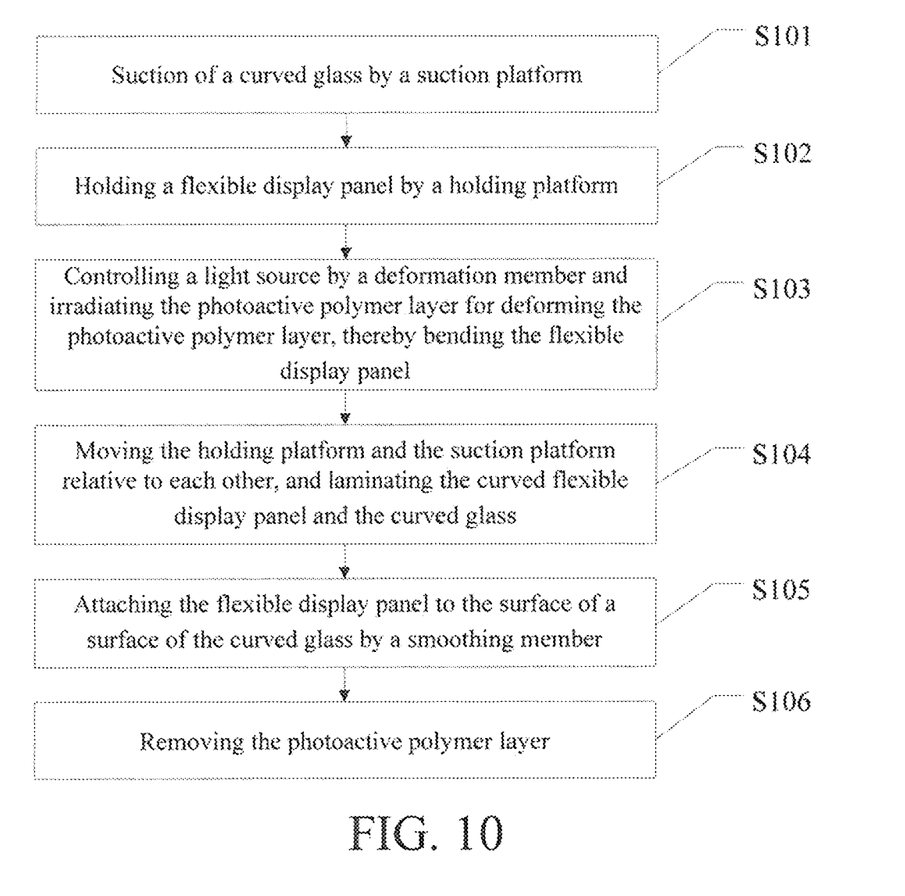
FIG. 10 is a schematic flow chart of a method for laminating a curved screen according to the present disclosure.

As shown in FIG. 9, the photoactive polymer layer c is removed after the laminating process is completed.

The present embodiment utilizes a photoactive polymer that automatically bends under an illumination condition. The deformation of the polymer is controlled by the illumination time. The polymer film is disposed on the lower surface of the corresponding material layer so that the material layer is bent under a specific illumination condition, thereby avoiding damage to the edge of the material layer and thus controlling the degree of bending of the material layer. At the same time, segmented lamination is used to achieve maximum control of the generation of air bubbles at edges.

According to the above embodiment, it is appreciated that:

the present disclosure coats a photoactive polymer layer on a surface of a flexible display panel. Then, the photoactive polymer layer drives the flexible display panel to bend toward the holding surface under the control of a light source of the deformation member to form a protuberant portion. Next, the holding platform moves relative to the suction platform, the protuberant portion of the curved flexible display panel is laminated to the curved glass. Finally, the smoothing member is on a surface of the photoactive polymer layer. The smoothing member start from the protuberant portion of the flexible display panel and presses a surface of the photoactive polymer layer to an edge of the flexible display panel using the smoothing member, thereby laminating the flexible display panel and the curved glass. The present disclosure is by directing the flexible display panel to bend and form a protuberant portion by the photoactive polymer layer. Then, the protuberant portion of the curved flexible display panel is laminated to the curved glass. The smoothing member is on a surface of the photoactive polymer layer. The smoothing member start from the protuberant portion of the flexible display panel and presses a surface of the photoactive polymer layer to an edge of the flexible display panel. Therefore, air bubbles are effectively discharged from edges and solve the problems of the existing technology of 3D laminating that air bubbles are difficult to be discharged to the edge because of the simultaneous contacting and laminating the CG and the panel with the central flat surface portion and the edge curved surfaces portion, and thus providing product yields.

In summary, although the present disclosure has been described with preferred embodiments thereof the above preferred embodiments is not used to limit the present disclosure. One of ordinarily skill in the art can carry out changes and modifications to the described embodiment without departing from the scope and the spirit of the present disclosure that is intended to be limited only by the appended claims.

The invention claimed is:

1. A curved screen laminating apparatus for laminating a flexible display panel to a curved glass to form a curved screen, comprising a holding platform, a suction platform, a deformation member, a photoactive polymer layer, and a smoothing member, wherein the holding platform is configured to hold the flexible display panel; and the holding platform comprises a holding surface with a protuberant form;

wherein the photoactive polymer layer comprises a photoactive polymer and a carbon nanomaterial layer, the photoactive polymer is disposed on a non-luminous side surface of the flexible display panel, the carbon nanomaterial layer is individually disposed and in contact with the photoactive polymer, and the photoactive polymer is disposed between the flexible display panel and the carbon nanomaterial layer;

wherein the suction platform and the holding platform are movably disposed relative to each other for suction of the curved glass;

wherein the deformation member comprises a light source, the light source is configured to irradiate the photoactive polymer layer;

wherein the photoactive polymer layer is deformable by irradiation of the light source, thereby bending the flexible display panel; and wherein the smoothing member is configured to attach the flexible display panel to a surface of the curved glass.

2. The curved screen laminating apparatus according to claim 1, wherein the smoothing member comprises a roller.

3. The curved screen laminating apparatus according to claim 2, wherein a radius of the roller is less than a minimum radius of curvature of a curved surface to an edge of the curved glass.

4. The curved screen laminating apparatus according to claim 2, wherein a surface portion of the roller is made of a flexible silicone material.

5. The curved screen laminating apparatus according to claim 1, wherein the holding platform further comprises a suction hole and the suction hole is disposed on the holding surface.

6. The curved screen laminating apparatus according to claim 1, wherein a top section of the holding surface is a flat surface and other portions of the holding surface are curved surfaces.

7. The curved screen laminating apparatus according to claim 1, wherein a top section of the holding surface possesses viscosity.

8. The curved screen laminating apparatus according to claim 1, wherein the holding platform is made of a hard silicone material.

9. The curved screen laminating apparatus according to claim 1, wherein a light emitting direction of the light source is directed toward the holding surface.

10. The curved screen laminating apparatus according to claim 1, wherein the photoactive polymer is a thermally responsive material layer.

11. The curved screen laminating apparatus according to claim 1, wherein the curved screen laminating apparatus further comprises a removal member for removing the photoactive polymer layer.

12. A method for laminating a curved screen using the curved screen laminating apparatus of claim 1, comprising:

suction of a curved glass by a suction platform;

holding a flexible display panel by a holding platform;

disposing a photoactive polymer on a non-luminous emitting side surface of the flexible display panel and disposing a carbon nanomaterial layer that individually disposed and in contact with the photoactive polymer, thereby forming a photoactive polymer layer that is deformable by irradiation of the light source, wherein the photoactive polymer is disposed between the flexible display panel and the carbon nanomaterial layer, the holding platform comprises a holding surface with a protuberant form;

controlling the light source by the deformation member and irradiating the photoactive polymer layer for deforming the photoactive polymer layer, thereby bending the flexible display panel;

moving the holding platform and the suction platform relative to each other, and laminating the curved flexible display panel and the curved glass; and attaching the flexible display panel to a surface of the curved glass by a smoothing member.

13. The method for laminating the curved screen according to claim 12, wherein the suction platform and the holding platform are movably disposed relative to each other, and the step of laminating the curved flexible display panel and the curved glass comprises:

driving the holding platform to move, and laminating a protuberant portion of the flexible display panel to the curved glass; and     releasing suction of the suction platform and removing the holding platform.

14. The method for laminating the curved screen according to claim 13, wherein the step of attaching the flexible display panel to the surface of the curved glass by the smoothing member comprises:

starting from the protuberant portion of the flexible display panel, pressing a surface of the photoactive polymer layer to an edge of the flexible display panel using the smoothing member, thereby laminating the flexible display panel and the curved glass.

15. The method for laminating the curved screen according to claim 14, wherein the step of starting from the protuberant portion of the flexible display panel, pressing the surface of the photoactive polymer layer to the edge of the flexible display panel using the smoothing member, thereby laminating the flexible display panel and the curved glass comprises:

using rollers to roll towards both ends of the photoactive polymer layer, such that the flexible display panel is laminated to the curved glass from the middle to the both ends of the flexible display panel.

16. The method for laminating the curved screen according to claim 12, wherein the step of controlling a light source by a deformation member and irradiating the photoactive polymer layer for deforming the photoactive polymer layer comprises:

evacuating the curved screen laminating apparatus into a vacuum condition.

17. The method for laminating the curved screen according to claim 16, wherein the step of attaching the flexible display panel to the surface of the curved glass by the smoothing member in the method for laminating the curved screen comprises:

releasing the vacuum condition of the curved screen laminating apparatus.

18. The method for laminating the curved screen according to claim 12, wherein the step of suction of the curved glass by the suction platform comprises:

holding the curved glass to the suction platform by coupling holding.

19. The method for laminating the curved screen according to claim 12, wherein the step of controlling a light source by a deformation member and irradiating the photoactive polymer layer for deforming the photoactive polymer layer comprises:

activating the light source;

irradiating the holding surface from the surface of the flexible display panel where the photoactive polymer layer is not disposed.

20. The method for laminating the curved screen according to claim 12, wherein the step of attaching the flexible display panel to the surface of the curved glass by the smoothing member in the method for laminating the curved screen comprises:

removing the photoactive polymer layer.

\* \* \* \* \*